(12) United States Patent
Lee et al.

(10) Patent No.: US 7,338,299 B1
(45) Date of Patent: Mar. 4, 2008

(54) SURFACE MOUNTED ELECTRONIC COMPONENT

(75) Inventors: Wen-Chin Lee, Tayuan (TW); Cheng-Hsien Lin, Tayuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 0 days.

(21) Appl. No.: 11/567,593

(22) Filed: Dec. 6, 2006

(30) Foreign Application Priority Data

Sep. 15, 2006 (CN) .................. 2006 1 0062621

(51) Int. Cl.
*H01R 12/00* (2006.01)
(52) U.S. Cl. ........................ 439/83; 439/876
(58) Field of Classification Search ............. 439/83, 439/876; 361/767, 768; 174/94 R, 263
See application file for complete search history.

(56) References Cited

U.S. PATENT DOCUMENTS

| 3,148,356 | A | * | 9/1964 | Hedden, Jr. ................. 365/55 |
|---|---|---|---|---|
| 5,569,880 | A | | 10/1996 | Galvagni et al. |
| 5,825,633 | A | * | 10/1998 | Bujalski et al. ............. 361/804 |
| 6,031,728 | A | * | 2/2000 | Bedos et al. ................ 361/767 |
| 6,534,726 | B1 | * | 3/2003 | Okada et al. ............... 174/263 |
| 6,862,190 | B2 | * | 3/2005 | Olzak et al. ................ 361/768 |
| 7,189,083 | B2 | * | 3/2007 | Seidler et al. ................ 439/83 |

* cited by examiner

*Primary Examiner*—James Harvey
(74) *Attorney, Agent, or Firm*—Jeffrey T. Knapp

(57) ABSTRACT

An exemplary surface mounted electronic component has block body including a bottom soldering surface, a top surface and a peripheral wall having a first peripheral wall portion and a second peripheral wall portion. The bottom soldering surface defines a first soldering area and a second soldering area. The first peripheral wall portion adjoins the first soldering area and has at least a first cutout defined between the first peripheral wall portion and the first soldering area. The second peripheral wall portion adjoins the second soldering area and has at least a second cutout defined between the second peripheral wall portion and the second soldering area. When the surface mounted electronic component is soldered, the melting solder can climb up the cutouts of the sidewall due to capillary effect and 'chimney effect', thereby avoiding 'tombstoning'.

12 Claims, 10 Drawing Sheets

SURFACE MOUNTED ELECTRONIC COMPONENT

TECHNICAL FIELD

The present invention generally relates to electronic components, and more particularly relates to a surface mounted electronic component.

BACKGROUND

'Tombstoning', also known as Drawbridge effect or Manhattan Skyline effect, is considered a common defect in surface mounting technology. 'Tombstoning', i.e., a phenomenon where electronic components erect like tombstones, is due to unbalanced surface tension of two soldered end portions of an electronic component. Particularly, when a low mass chip-type electronic component is soldered on a substrate such as a printed circuit board, the unbalanced surface tension may easily occur and draw one soldered end portion to the substrate and the other soldered end portion free, thus causing 'tombstoning'.

Generally, the unbalanced surface tension of two soldered end portions occurs due to poor soldering pad design, non-uniform heating of soldering surfaces, low reactivity of solder, non-uniform application of solder and so on.

With the current trend toward miniaturization of electronic devices there is a concomitant trend toward reducing the size of the electronic components themselves. The reduction in size and mass of electronic components has been a significant aid in the miniaturization process but has created problems such as 'tombstoning'. Referring to FIG. 9 and FIG. 10, such a typical electronic component 10 is prone to tombstoning on a printed circuit board 12 due to unbalanced surface tension of two soldered end portions. 'Tombstoning' can cause electric connections between the electronic component and circuits to be broken, resulting in the electronic component losing its functions and causing a mounting failure.

What is needed, therefore, is a surface mounted electronic component having ability of avoiding 'tombstoning'.

SUMMARY

One preferred embodiment provides a surface mounted electronic component. The surface mounted electronic component has a block body. The block body includes a bottom soldering surface, a top surface opposite to the bottom soldering surface and a peripheral wall. The bottom soldering surface defines a first soldering area and a second soldering area. The peripheral wall includes a first peripheral wall portion and a second peripheral wall portion. The first peripheral wall portion adjoins the first soldering area of the bottom soldering surface and has a first cutout defined between the first peripheral wall portion and the first soldering area of the bottom soldering surface. The second peripheral wall portion adjoins the second soldering area of the bottom soldering surface and has a second cutout defined between the second peripheral wall portion and the second soldering area of the bottom soldering surface.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF PREFERRED EMBODIMENTS

Embodiments will now be described in detail below and with reference to the drawings.

Figure 1:
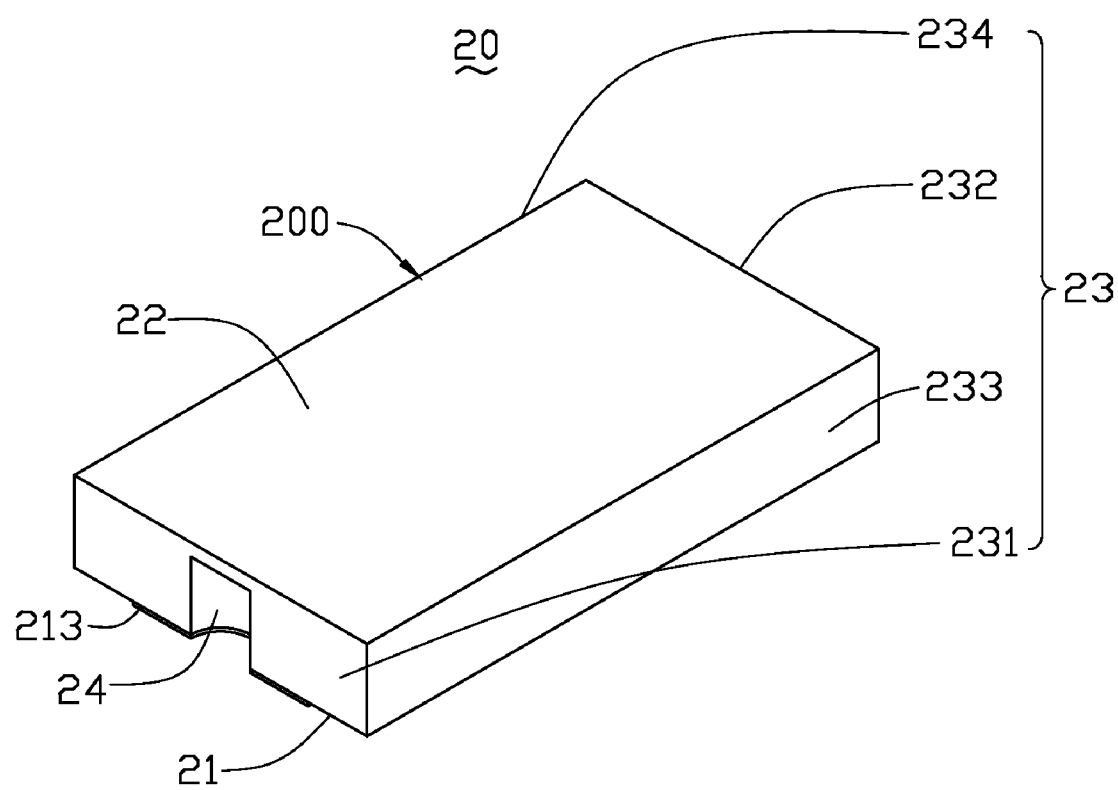
FIG. 1 is a schematic view of a surface mounted electronic component according to a first embodiment.
Figure 2:
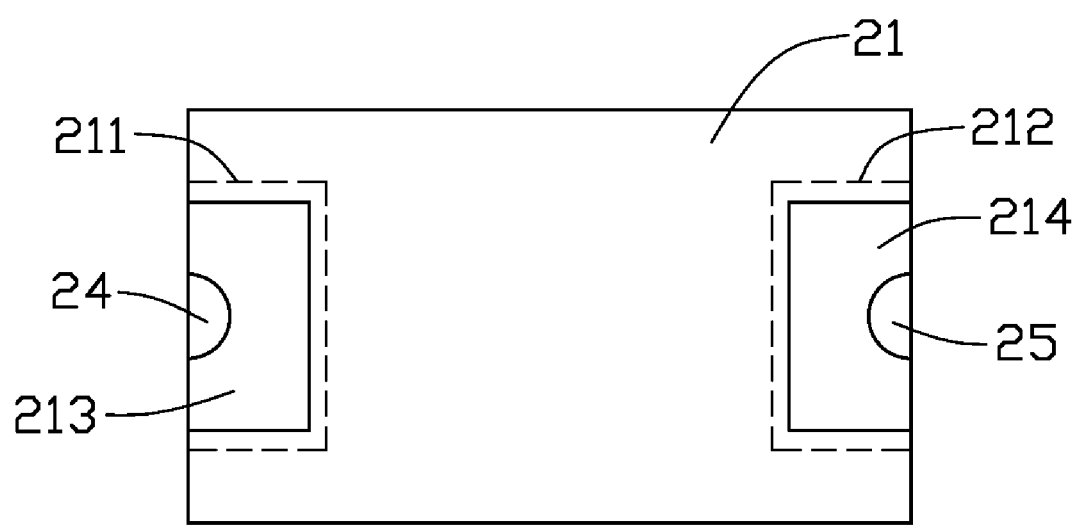
FIG. 2 is a bottom view of the surface mounted electronic component according to the first embodiment.

Referring to FIG. 1 and FIG. 2, a surface mounted electronic component 20 according to a first exemplary embodiment is shown.

The surface mounted electronic component 20 has a block body 200. The block body 200 has a polyhedron configuration. In the embodiment, the block body 200 is a rectangular parallelepiped having a soldering bottom surface 21, a top surface 22 opposite to the soldering bottom surface 21 and a peripheral wall 23. The peripheral wall 23 adjoins the soldering bottom surface 21 and the top surface 22 simultaneously. The peripheral wall 23 includes a first peripheral wall portion 231 and a second peripheral wall portion 232 opposite to the first peripheral wall portion 231, a third peripheral wall portion 233 and a fourth peripheral wall portion 234 opposite to the third sidewall section 233. Therefore, the first peripheral wall portion 231, the second peripheral wall portion 232, the third peripheral wall portion 233 and the fourth peripheral wall portion 234 adjoin both the soldering bottom surface 21 and the top surface 22.

The soldering bottom surface 21 defines a first soldering area 211 and a second soldering area 212. The first soldering area 211 adjoins the first peripheral wall portion 231 and the second soldering area 212 adjoins the second peripheral wall portion 232. The first soldering area 211 and the second soldering area 212 are symmetrical.

A first cutout 24 is defined between the first peripheral wall portion 231 and the first soldering area 211 of the bottom soldering surface 21. A second cutout 25 is defined between the second peripheral wall portion 232 and the second soldering area 212 of the bottom soldering surface 21. Preferably the first cutout 24 should extend in a direction perpendicular to the first soldering area 211, and the second cutout 25 should extend in a direction perpendicular to the second soldering area 212. Alternatively, the first/second cutout could be a through hole or a blind hole defined in the first/second soldering area of the bottom soldering surface, and should be considered to be within the scope of the present invention. Cross-section shape of the first cutout 24 and the second cutout 25 taken normal to the bottom soldering surface 21 can be selected from the group consisting of arc-shaped, U-shaped, V-shaped, and broken-lines-shaped. In the embodiment, cross-section shape of the first cutout 24 taken normal to the bottom soldering surface is arc-shaped and cross-section shape of the second cutout 25 taken normal to the bottom soldering surface is also arc-shaped.

Additionally, a first soldering pad 213 and a second soldering pad 214 can be attached on the first soldering area 211 and the second soldering area 212 respectively. The first soldering pad 213 and the second soldering pad 214 are configured for facilitating soldering of the surface mounted electronic component 20.

The surface mounted electronic component 20 can be mounted by interposing solder between the soldering areas and a circuit board and melting the solder to provide mechanical and electrical connections between the surface mounted electronic component 20 and circuits on the circuit board.

Capillary effect can occur due to the thin first cutout 24 and the thin second cutout 25 like capillary tubes. Capillary effect is the ability of a substance to draw a liquid upwards against the force of gravity. Due to capillary effect the melting solder on the first soldering area 211 can climb up the first cutout 24 along the inside wall thereof, and the melting solder on the second soldering area 212 also can climb up the second cutout 25 along the inside wall thereof. Therefore, the first cutout 24 and the second cutout 25 can be filled with solder, thereby increasing area the surface mounted electronic component 20 contacting with the solder.

Whilst melting the solder, temperature of downside portion of the first cutout 24 adjoining the soldering bottom surface 21 is higher than temperature of upside portion of the first cutout 24 adjoining the top surface 21, and temperature of downside portion of the second cutout 25 adjoining the soldering bottom surface 21 is higher than temperature of upside portion of the second cutout 25 adjoining the top surface 21. Temperature difference causes a 'chimney effect'. The 'chimney effect' is a tendency of heated air to rise in a duct or other vertical passage that results from thermal differences. Thermal differences between the downside portion and upside portion of the cutouts will result in pressure differences, because warm air is less dense than cold air. The less dense warm air in the downside portion will rise because of its thermal buoyancy, thereby making the melting solder climb up the first cutout 24 and the second cutout 25 along the inside wall thereof respectively and fill the first cutout 24 and the second cutout 25 respectively.

The solder filled into the first cutout 24 and the second cutout 25 connect with the solder between the soldering bottom surface 21 and the circuit board, thereby forming a whole. Thus the unbalanced surface tension between the first soldering area 211 and the second soldering area 212 of the surface mounted electronic component 20 can be balanced, thereby avoiding 'tombstoning'. As a result, the surface mounted electronic component 20 can be mounted on the circuit board hard.

Additionally, cutouts can also be defined in the third peripheral wall portion 233 and the fourth peripheral wall portion 234 respectively. Thus, area the surface mounted electronic component 20 contacting with the solder can be further increased, thereby reinforcing mounting of the surface mounted electronic component 20 on the circuit board.

Figure 3:
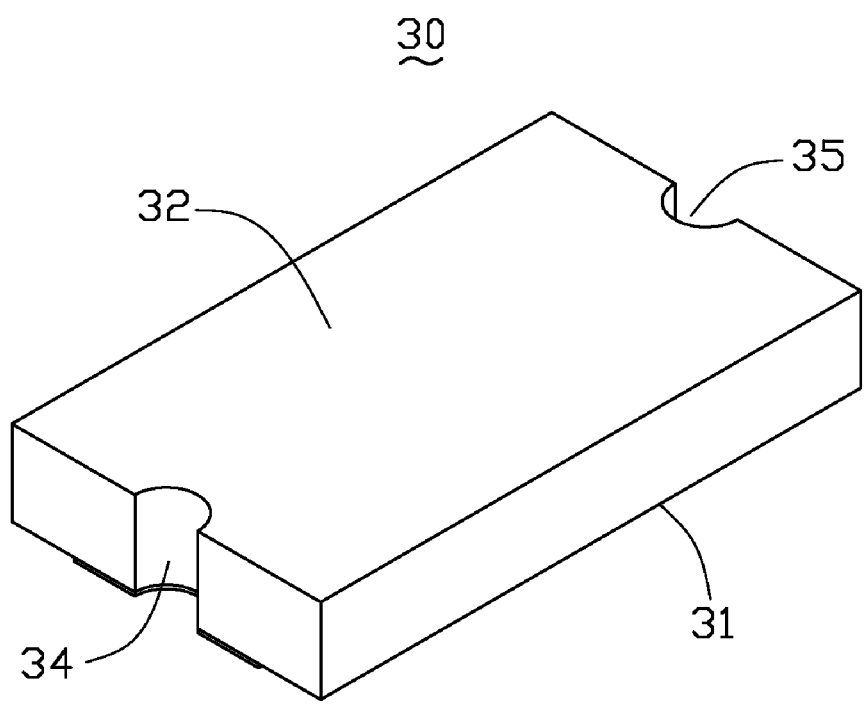
FIG. 3 is a schematic view of a surface mounted electronic component according to a second embodiment.
Figure 4:
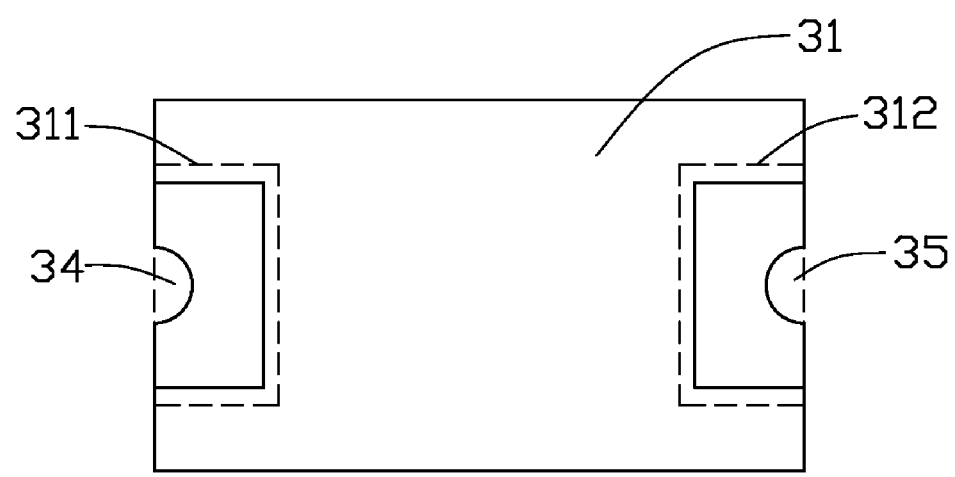
FIG. 4 is a bottom view of the surface mounted electronic component according to the second embodiment.

Referring to FIG. 3 and FIG. 4, a surface mounted electronic component 30 according to a second exemplary embodiment is shown. The surface mounted electronic component 30 is similar to the surface mounted electronic component 20 in the first exemplary embodiment except that a first cutout 34 is defined between the first soldering area 311 of the bottom soldering surface 31 and the top surface 32 and a second cutout 35 is also defined between the second soldering area 312 of the bottom soldering surface 31 and the top surface 32.

Figure 5:
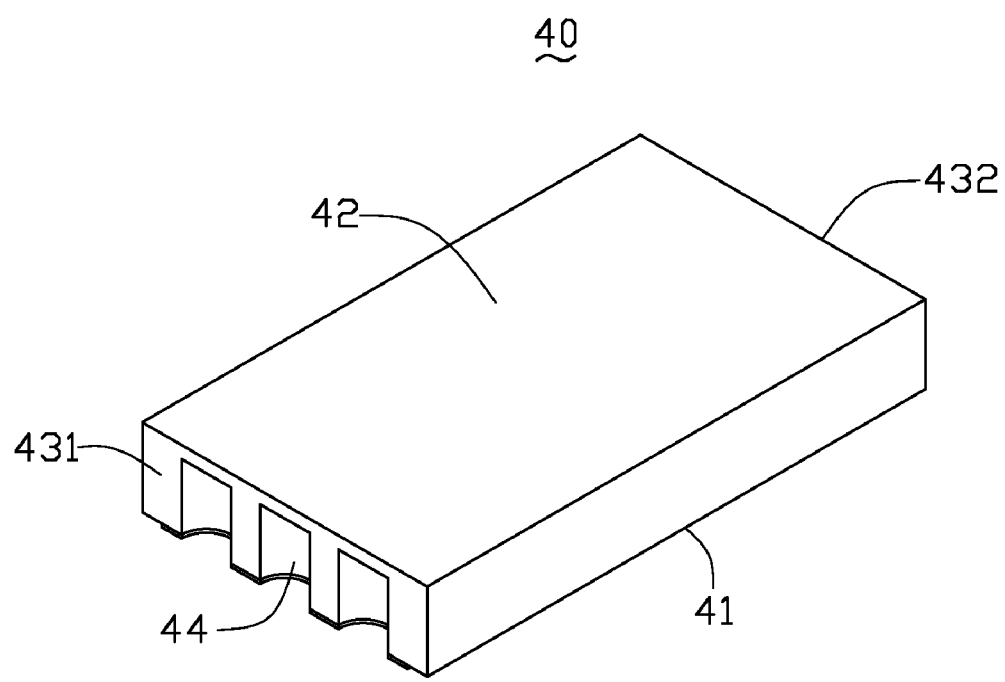
FIG. 5 is a schematic view of a surface mounted electronic component according to a third embodiment.
Figure 6:
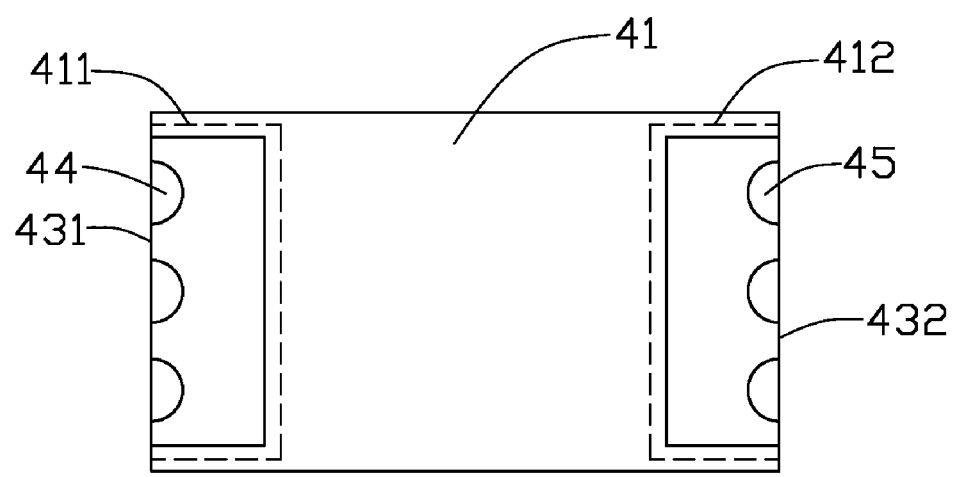
FIG. 6 is a bottom view of the surface mounted electronic component according to the third embodiment.

Referring to FIG. 5 and FIG. 6, a surface mounted electronic component 40 according to a third exemplary embodiment is shown. The surface mounted electronic component 40 is similar to the surface mounted electronic component 20 in the first exemplary embodiment except that a number of first cutouts 44 are defined between the first peripheral wall portion 431 and the first soldering area 411 of the bottom soldering surface 41 and a number of second cutouts 45 are defined between the first peripheral wall portion 431 and the first soldering area 411 of the bottom soldering surface 41. When the surface mounted electronic component 40 is soldered, due to capillary effect and the 'chimney effect', the melting solder on a first soldering area 411 can climb up the first cutouts 44 along the inside wall thereof, and the melting solder on a second soldering area 412 can also climb up the second cutouts 45 along the inside wall thereof. Thus area of the surface mounted electronic component 40 contacting with the solder can be further increased, thereby further balancing the surface tension between the first soldering area 411 and the second soldering area 412 of the surface mounted electronic component 40 and reinforcing mounting of the surface mounted electronic component 40 on the circuit board.

Figure 7:
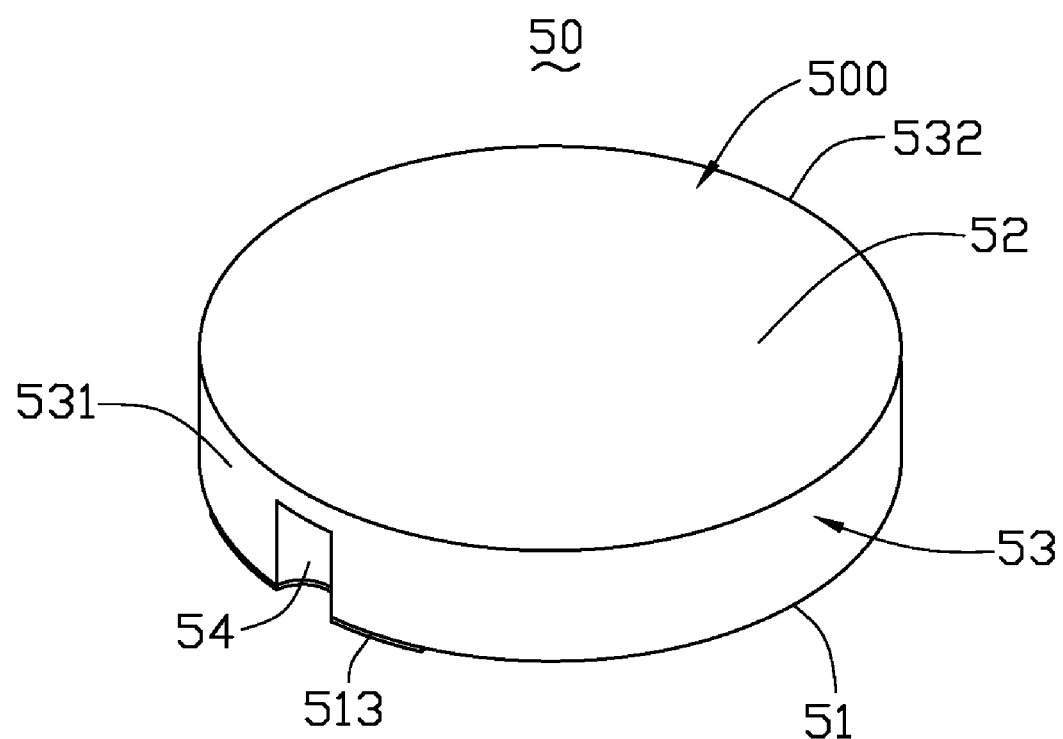
FIG. 7 is a schematic view of a surface mounted electronic component according to a fourth embodiment.
Figure 8:
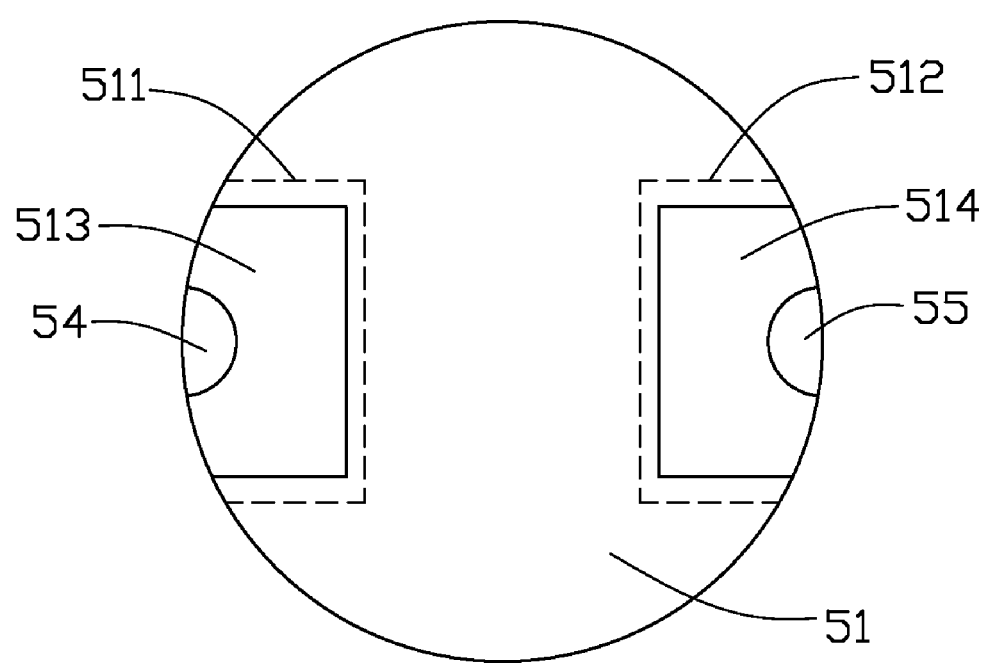
FIG. 8 is a bottom view of the surface mounted electronic component according to the fourth embodiment.
Figure 9:
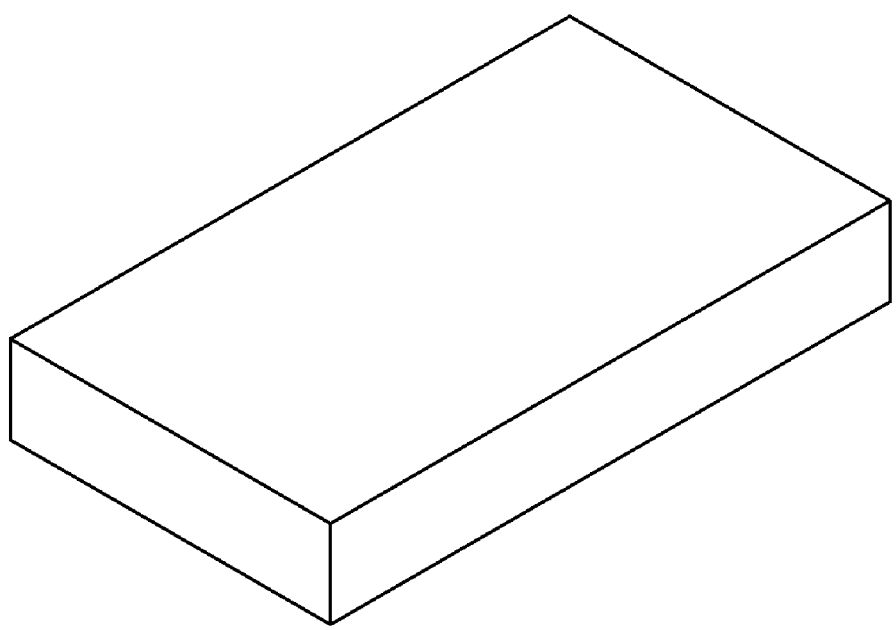
FIG. 9 is a schematic view of a typical surface mounted electronic component.
Figure 10:
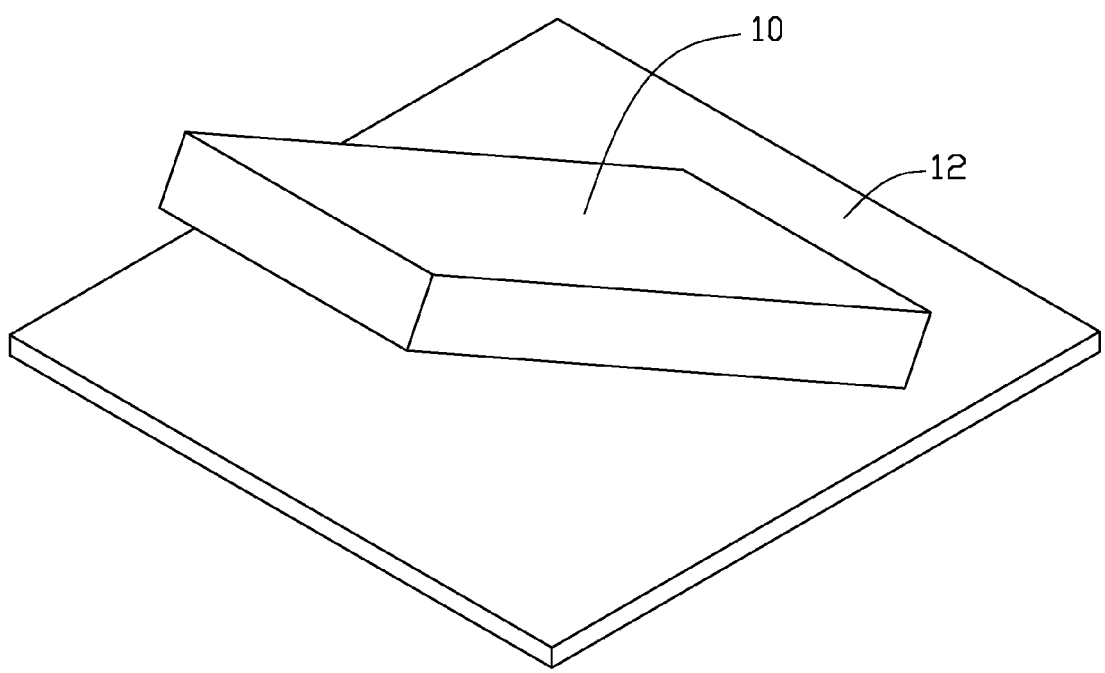
FIG. 10 is a schematic view of 'tombstoning' on a typical surface mounted electronic component.

Additionally, the surface mounted electronic component can have a configuration of any other structure. Referring to FIG. 7 and FIG. 8, a surface electronic component 50 according to a fourth exemplary embodiment is shown. The surface electronic component 50 has a block body 500. The block body 500 is a cylinder having a soldering bottom surface 51, a top surface 52 opposite to the soldering bottom surface 51 and a peripheral wall 53. The peripheral wall 53 adjoins the soldering bottom surface 21 and the top surface 22 simultaneously. The peripheral wall 53 includes a first peripheral wall portion 531 and a second peripheral wall portion 532 opposite to the first peripheral wall portion 531. Therefore, the first peripheral wall portion 531 and the second peripheral wall portion 532 adjoin both the soldering bottom surface 51 and the top surface 52.

The soldering bottom surface 51 defines a first soldering area 511 and a second soldering area 512. The first soldering area 511 adjoins the first peripheral wall portion 531 and the second soldering area 512 adjoins the second peripheral wall portion 532. The first soldering area 511 and the second soldering area 512 are symmetrical. A first cutout 54 is defined between the first peripheral wall portion 531 and the first soldering area 511 of the bottom soldering surface 51 and a second cutout 55 is defined between the first peripheral wall portion 531 and the first soldering area 511 of the bottom soldering surface 51. The first cutout 54 is symmetrical to the second cutout 55. Moreover, the first cutout 54 can be defined between the first soldering area 511 of the bottom soldering surface 21 and the top surface 52, and the second cutout 55 can be defined between the second soldering area 512 of the bottom soldering surface 51 and the top surface 52. Preferably, the first cutout 54 should extend in a direction perpendicular to the first soldering area 511, and the second cutout 55 should extend in a direction perpendicular to the second soldering area 512. Cross-section shape of the first cutout 54 and the second cutout 55 taken normal to the bottom soldering surface 51 can be selected from the group consisting of arc-shaped, U-shaped, V-shaped, and broken-lines-shaped. In the embodiment, cross-section shape of the first cutout 54 taken normal to the bottom soldering surface 51 is arc-shaped and cross-section shape of the second cutout 55 taken normal to the bottom soldering surface 51 is also arc-shaped. Additionally, a first soldering pad 513 and a second soldering pad 514 can be attached on the first soldering area 511 and the second soldering area 512 respectively, thereby facilitating soldering of the surface mounted electronic component 50.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A surface mounted electronic component having a block body, comprising:
    a bottom soldering surface comprising a first soldering area and a second soldering area,
    a top surface opposite to the bottom soldering surface,
    a first peripheral wall portion adjoining the first soldering area of the bottom soldering surface, the first peripheral wall portion having at least a first cutout defined between the first peripheral wall portion and the first soldering area of the bottom soldering surface, the first cutout being so dimensioned that it will exhibit a capillary effect and a chimney effect, and
    a second peripheral wall portion adjoining the second soldering area of the bottom soldering surface, the second peripheral wall portion having at least a second cutout defined between the second peripheral wall portion and the second soldering area of the bottom soldering surface, the second cutout being so dimensioned that it will exhibit a capillary effect and a chimney effect.

2. The surface mounted electronic component as claimed in claim 1, wherein the first cutout is defined between the first soldering area of the bottom soldering surface and the top surface so as to be filled with solder by the capillary effect and the chimney effect.

3. The surface mounted electronic component as claimed in claim 2, wherein the second cutout is defined between the second soldering area of the bottom soldering surface and the top surface so as to be filled with the solder by the capillary effect and chimney effect.

4. The surface mounted electronic component as claimed in claim 1, wherein a cross-section of the first cutout taken normal to the bottom soldering surface is selected from a group consisting of arc-shaped, U-shaped, V-shaped, and broken-lines-shaped.

5. The surface mounted electronic component as claimed in claim 4, wherein a cross-section of the second cutout taken normal to the bottom soldering surface is selected from a group consisting of arc-shaped, U-shaped, V-shaped, and broken lines-shaped.

6. The surface mounted electronic component as claimed in claim 1, wherein the block body has a configuration of polyhedron.

7. The surface mounted electronic component as claimed in claim 6, wherein the polyhedron is a rectangular parallelepiped.

8. The surface mounted electronic component as claimed in claim 1, wherein the block body has a configuration of cylinder.

9. The surface mounted electronic component as claimed in claim 1, wherein the first soldering area and the second soldering area are symmetrical.

10. The surface mounted electronic component as claimed in claim 1, wherein the first cutout extends in a direction perpendicular to the first soldering area.

11. The surface mounted electronic component as claimed in claim 10, wherein the second cutout extends in a direction perpendicular to the second soldering area.

12. The surface mounted electronic component as claimed in claim 1, further comprising a first and a second soldering pads attached on the first soldering area and the second soldering area respectively.

* * * * *